United States Patent [19]

Pham

[11] Patent Number: 5,245,298
[45] Date of Patent: Sep. 14, 1993

[54] VOLTAGE CONTROLLED OSCILLATOR HAVING CASCODED OUTPUT

[75] Inventor: Phuc C. Pham, Chandler, Ariz.

[73] Assignee: Motorola, Inc., Schaumburg, Ill.

[21] Appl. No.: 921,668

[22] Filed: Jul. 30, 1992

[51] Int. Cl.[5] .............................................. H03B 5/12
[52] U.S. Cl. .................................. 331/117 R; 331/74
[58] Field of Search ............... 331/74, 116 R, 116 FE, 331/17 R, 117 FE

[56] References Cited

U.S. PATENT DOCUMENTS 3,832,653  8/1974  Nugent et al. ............... 331/117 R X
5,107,228  4/1992  Pham et al. .................... 331/117 R

*Primary Examiner*—David Mis
*Attorney, Agent, or Firm*—Bradley J. Botsch, Sr.

[57] ABSTRACT

A voltage controlled oscillator (VCO) circuit having a cascoded output stage has been provided. The VCO circuit includes an oscillation stage which utilizes a negative resistance technique for oscillation, and an output stage that is coupled in cascode with the oscillation stage thereby minimizing the power dissipation and allowing the output resistance of the VCO circuit to be adjusted for maximum drive capability.

13 Claims, 2 Drawing Sheets

5,245,298

VOLTAGE CONTROLLED OSCILLATOR HAVING CASCODED OUTPUT

BACKGROUND OF THE INVENTION

This invention relates to oscillators, for example, a voltage controlled oscillator circuit having a cascoded output.

Voltage controlled oscillator (VCO) circuits are well known in the art and are utilized in a number of applications. A VCO circuit typically includes a variable element such as a capacitor that may be varied to adjust the frequency of an output signal of the VCO circuit.

A VCO circuit typically includes some type of output stage such that the output impedance of the VCO circuit is a suitable value. An output stage that is coupled to an oscillator circuit via a coupling capacitor is disclosed in U.S. Pat. No. 5,107,228 and having an issue date of Apr. 21, 1992. This patent discloses a VCO circuit having an output amplifier for providing an adjustable output impedance. However, the circuits shown in FIGS. 1 and 2 have a common emitter output stage which does not provide high gain amplification. Further, the circuits shown in FIGS. 1 and 2 require a separate bias current for both the output amplifier and the oscillation stage and, thus, are not power efficient.

Hence, there exists a need to provide an improved VCO circuit having an output stage with an adjustable output impedance and high gain amplification while consuming minimum power.

DETAILED DESCRIPTION OF THE DRAWINGS

Figure 1:
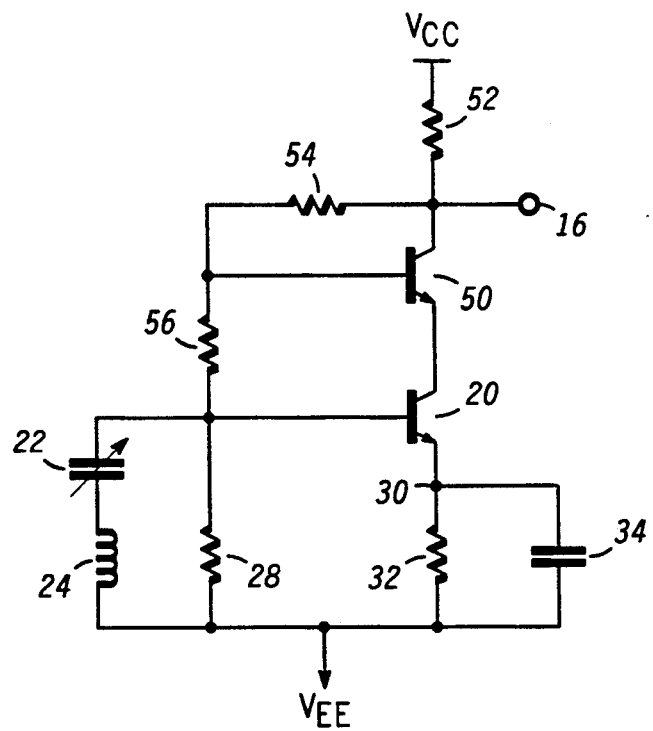
FIG. 1 is a detailed schematic diagram illustrating a first embodiment of a voltage controlled oscillator circuit having a cascoded output stage in accordance with the present invention.

Referring to FIG. 1, a detailed schematic diagram illustrating voltage controlled oscillator (VCO) circuit 10 having an output at terminal 16 is shown. VCO circuit 10 comprises an oscillator stage which includes oscillator transistor 20 which has a base coupled through series connected variable capacitor 22 and inductor 24 to a first supply voltage terminal at which the potential $V_{EE}$ is applied. The base of transistor 20 is also coupled through resistor 28 to the first supply voltage terminal. The emitter of transistor 20 is coupled to circuit node 30 wherein resistor 32 and capacitor 34 are coupled in parallel between circuit node 30 and the first supply voltage terminal. The collector of transistor 20 represents an output of the oscillator stage.

VCO circuit 10 also includes a common base amplifier stage which includes transistor 50 having a collector, which represents the output of the amplifier output stage, coupled to terminal 16 and through resistor 52 to a second supply voltage terminal at which the operating potential $V_{CC}$ is applied. The base of transistor 50 is coupled through feedback resistor 54 to the collector of transistor of 50. Further, the base of transistor of 50 is coupled through resistor 56 to the base of transistor 20. The emitter of transistor 50, which represents the input of the amplifier output stage, is coupled to the collector of transistor 20.

In operation, the oscillation stage comprises transistor 20, resistors 28 and 32, capacitors 22 and 34 and inductor 24. In particular, resistor 28 (in conjunction with resistors 52, 54 and 56) form a bias network for providing predetermined bias voltages at the bases of transistors 20 and 50. These predetermined bias voltages provide a predetermined current to flow through transistors 50 and 20.

VCO circuit 10 will oscillate if the total resistance in the loop formed by inductor 24, capacitor 22, transistor 20 and the parallel combination of resistor 32 and capacitor 34 is negative. This is based on the fact that an ideal tuned circuit will oscillate indefinitely if there is no resistance element present to dissipate energy. Thus, VCO circuit 10 will oscillate if the real part of the input impedance of transistor 20 is sufficiently negative to yield an overall negative resistance for the loop.

The analysis of calculating the input resistance of transistor 20 is discussed in detail on pages 243-245 of "Modern Communication Circuits", McGraw-Hill Publishing Co., 1985. The final result for the real part of the input impedance ($r_i$) of transistor 20 is shown in EQN. 1.

$$r_i = -g_m/(w^2 \times C_{BE} \times C_E) \quad (1)$$

where $g_m$ is the transconductance of transistor 20;

w is the operating frequency;

$C_{BE}$ is the base-emitter capacitance of transistor 20; and $C_E$ the capacitance seen at the emitter of transistor 20.

It must be understood that if the magnitude of $r_i$ as shown in EQN. 1 is greater than the sum of any other resistances within the loop, then transistor 20 will be able to supply the dissipated energy of the inductor (or capacitor). Thus, VCO circuit 10 will be able to sustain oscillation.

As a result, the signal appearing at the collector of transistor 20 is an oscillatory signal which oscillates at a center frequency ($F_C$) substantially equal to $[2 \times pi \times (L \times C_{eqiv})^{-\frac{1}{2}}]$ where pi=3.1415927, L is the inductance of external inductor 24 and $C_{equiv}$ is the equivalent capacitance of the loop as expressed in EQN. 2.

$$C_{equiv} = C_{22}//(C_{34} + C_{BE20})//(C_{CS20} + C_{CB20})) \quad (2)$$

where $C_{BE20}$ is the base-emitter capacitance of transistor 20;

$C_{CB20}$ is the collector-base capacitance of transistor 20;

$C_{CS20}$ is the substrate capacitance of transistor 20; and

// means "in parallel with".

It should be understood that by varying the value of capacitor 22, the equivalent capacitance as expressed in EQN. 2 is varied thereby varying the center frequency of the signal appearing at the collector of transistor 20. Further, it is worth noting that capacitor 22 may take the form of a varactor wherein adjusting the voltage applied across the varactor will adjust the center frequency.

The cascoded common base amplifier stage includes transistor 50 and resistors 52, 54, 56 and 28 wherein resistors 28 and 56 together form the source resistance of the amplifier stage. The common base amplifier stage is essentially an inverting amplifier having an input at the emitter of transistor 50, and an output at the collector of transistor 50.

Resistor 54 is a negative feedback resistor coupled between the collector and base of transistor 50. Further, resistors 56 and 28 function as a source resistor being coupled between the base of transistor 50 and the first supply voltage terminal. Therefore, the oscillatory signal appearing at the emitter of transistor 50 is amplified by the ratio of resistor 54 to resistors 56 and 28 [$R_{54}/(R_{56}+R_{28})$], and subsequently provided at terminal 16. Further, as aforementioned, resistors 52, 54, 56 and 28 can be chosen to set the bias current through transistor 50 (and also transistor 20). It is worth noting that resistor 28 has a dual purpose: 1) to provide the proper bias voltage at the base of transistor 20 which is used to set the current through transistor 20 via resistor 32, and 2) to be summed with resistor 56 to form a source resistor for the common base amplifier stage.

A great advantage of the common base amplifier stage is that its output resistance (the resistance seen with feedback from terminal 16 to the collector of transistor 50) can be adjusted to be a predetermined resistance, for example 50 ohms.

By utilizing the small signal model for transistor 50, the output resistance of the common base amplifier stage which is taken at the collector of transistor 50 ($R_{OUT}$) can be simplified to the expression shown in EQN. 3.

$$R_{OUT}=(R_{52}//R_{54})/[1-Bxg_m(R_{52}//R_{54})((R_{56}+R_{28})//R_{54}//r_{pi})] \quad (3)$$

where
- ($R_{52}//R_{54}$) is the equivalent resistance seen looking in from the collector of transistor 50;
- B is the loop gain which is substantially equal to ($-1/R_{54}$);
- $g_m$ and $r_{pi}$ are respectively the transconductance and the small signal input resistance of transistor 50; and
- (($R_{56}+R_{28}$)//$R_{54}$//$r_{pi}$) is the equivalent resistance seen looking in from the base of transistor 50.

The values for $g_m$ and $r_{pi}$ are dependent upon the collector current through transistor 50, as is well known. Further, the collector current through transistor 50 can be adjusted by choosing different values for resistor 52 (or 54, 56 or 28). Hence, the output resistance ($R_{OUT(16)}$) can easily be adjusted by choosing different values for these resistors.

Another advantage of the circuit shown in FIG. 1 is that because transistors 20 and 50 are cascoded and share the same bias current, the power dissipation of VCO circuit 10 is minimized. Further, since the amplifier is in a common base configuration, transistor 50 does not suffer from the miller effect and, thus, the high frequency response of VCO circuit 10 is not limited by the miller effect.

In summary, the output resistance seen from looking in from terminal 16 can be adjusted via resistors 52, 54, 56 or 28. Thus, output impedance of VCO circuit 10 of FIG. 1 can be designed to match the input impedance of a circuit (not shown) coupled to terminal 16 for maximum drive capability. Further, VCO circuit 10 includes and a common base amplifier stage which is cascoded with an oscillation stage thereby providing minimum power dissipation and better high frequency performance.

Figure 2:
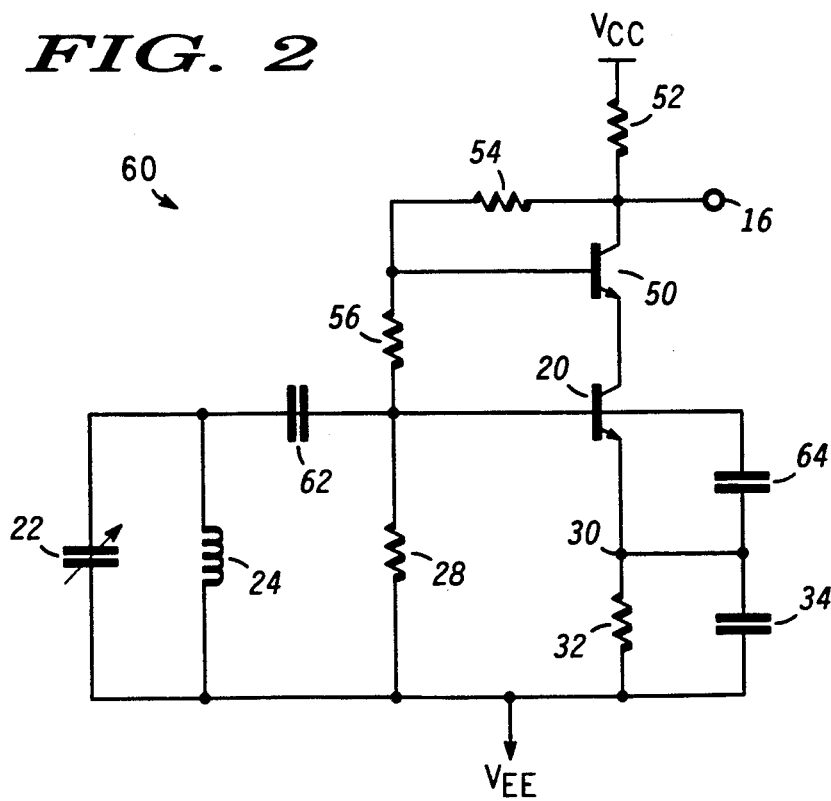
FIG. 2 is a detailed schematic diagram illustrating a second embodiment of a voltage controlled oscillator circuit having a cascoded output stage in accordance with the present invention.

Referring to FIG. 2, a detailed schematic diagram illustrating voltage controlled oscillator circuit 60 is shown. It is understood that components shown in FIG. 2 which are identical to the components shown in FIG. 1 are identified by the same reference numbers. In VCO circuit 60, inductor 24 and capacitor 22 are parallel coupled as opposed to being series connected in VCO circuit 10 of FIG. 1.

The oscillation stage of the circuit of FIG. 2 further includes capacitor 62 which is coupled between the base of transistor 20 and a first terminal of inductor 24. The second terminal of inductor 24 is coupled to the first supply voltage terminal. Capacitor 22 is now parallel coupled across inductor 24. Capacitor 62 provides a DC block to prevent leakage current from capacitor 22 and inductor 24 from flowing into the base of transistor 20. Further, capacitor 64 is coupled across the base and emitter of transistor 20 thereby minimizing the variation of the base-emitter capacitance ($C_{BE}$) of transistor 20.

The operation of VCO circuit 60 is very similar to the aforedescribed operation of VCO circuit 10 of FIG. 1. However, due to the addition of capacitors 62 and 64, the $C_{equiv}$ around the oscillation loop is calculated slightly different from the formula expressed in EQN. 2. As a result, the center frequency ($F_C$) of VCO circuit 60 is calculated differently than the center frequency of VCO circuit 10. In particular, the $C_{equiv}$ for VCO circuit 60 is expressed in EQN. 4.

$$C_{equiv}=C_{22}+C_{62}//[(C_{64}+C_{BE20})//C_{34}+(C_{CB20}//C_{CS20})] \quad (4)$$

where
- $C_{BE20}$ is the base-emitter capacitance of transistor 20;
- $C_{CB20}$ is the collector-base capacitance of transistor 20; and
- $C_{CS20}$ is the substrate capacitance of transistor 20.

Thus, the center frequency for VCO circuit 60 is substantially equal to [$2\times pi\times(L\times C_{equiv})^{-\frac{1}{2}}$] where $C_{equiv}$ is the capacitance calculated according to EQN. 4.

Also, it is worth noting that VCO circuit 60 has a narrower tuning range than VCO circuit 10 due to capacitor 64 being in parallel with the base-emitter capacitance of transistor 20. Thus, a wider frequency tuning range with less fine tuning capability is achieved with VCO circuit 10, while a narrower frequency tuning range with a higher fine tuning capability is achieved with VCO circuit 60.

Figure 3:
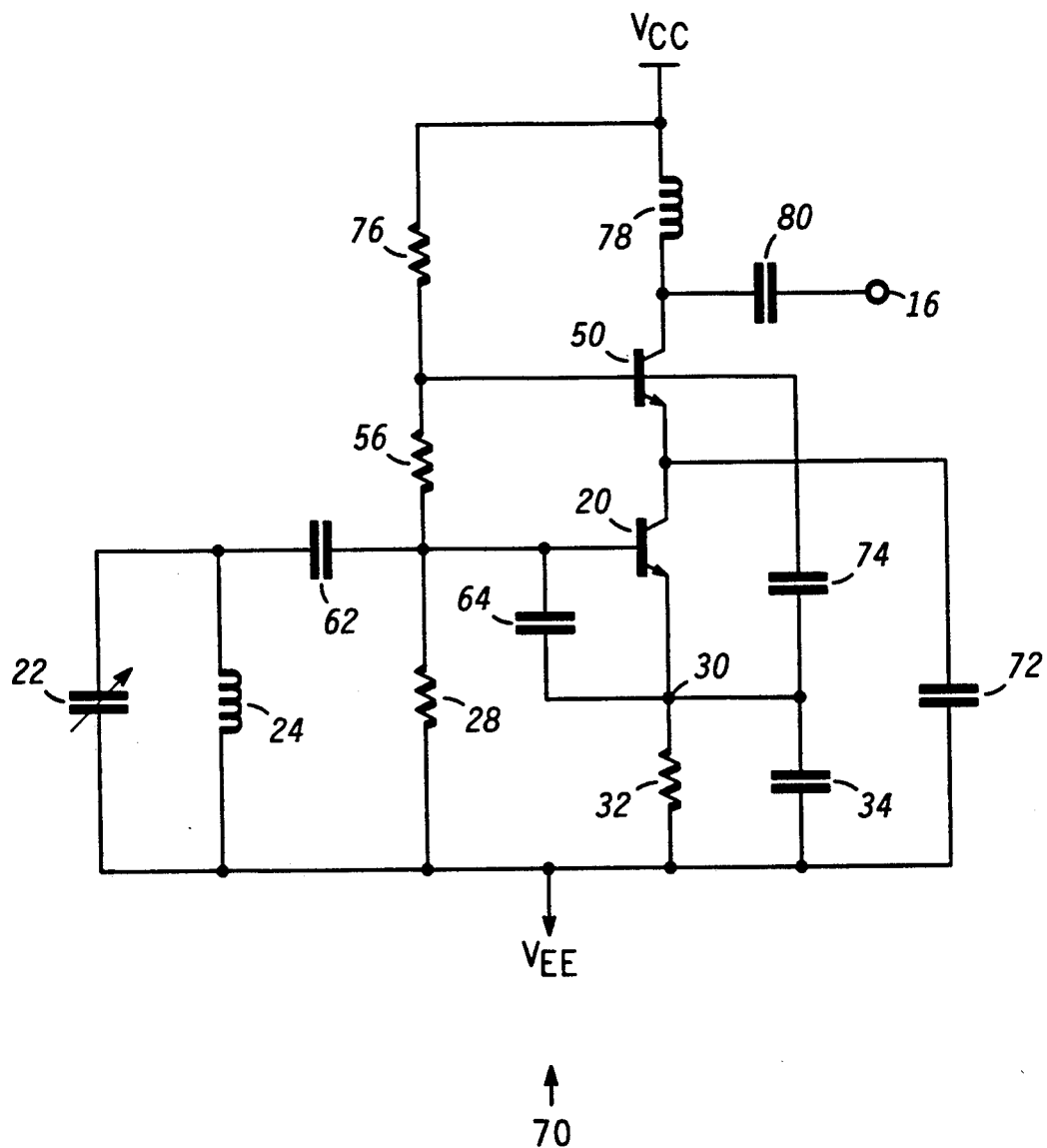
FIG. 3 is a detailed schematic diagram illustrating a third embodiment of a voltage controlled oscillator circuit having a cascoded output stage in accordance with the present invention.

Referring to FIG. 3, a detailed schematic diagram illustrating VCO circuit 70 is shown. It is understood that components shown in FIG. 3 which are identical to the components shown in FIGS. 1 and 2 are identified by the same reference numbers. VCO circuit 70 further includes capacitor 72 coupled between the collector of transistor 20 and the first supply voltage terminal for minimizing the variation in the substrate capacitance of transistor 20. Negative feedback capacitor 74 is coupled between the base of transistor 50 and the emitter of transistor 20 for reducing the miller effect on VCO circuit 70. Resistor 76 is coupled between the base of transistor 50 and the second supply voltage terminal. Further, matching elements 78 and 80 are shown wherein inductor 78 is coupled between the second supply voltage terminal and the collector of transistor 50, and capacitor 80 is coupled between the collector of transistor 50 and terminal 16.

The operation of VCO circuit 70 is similar to the operation of VCO circuit 60 wherein VCO circuit 70 will oscillate if the real part of the input impedance of transistor 20 is sufficiently negative to yield an overall negative resistance for the oscillation loop as aforedescribed. However, calculating the $C_{equiv}$ for VCO circuit 70 is quite involved as expressed in EQN. 5.

$$C_{equiv} = C_{22} + \{C_{62}//[(C_{64}+C_{BE20})//((C_{34}+C_{74}(1+K))//(C_{64}+C_{BE20})) + C_{CB20}//(((C_{CB50}//C_{S50})//C_{BE50}) + C_{S20} + C_{72})]\} \quad (5)$$

where K is the negative ratio of the voltage at the base of transistor 50 and the voltage at the emitter of transistor 20 ($-V_{B50}/V_{E20}$).

Further, the output stage of VCO circuit 70 (which includes transistor 50, resistors 76, 56 and 28, and matching elements 78 and 80) is different from the output stages shown in FIGS. 1 and 2. Note that the feedback resistor 54 is not present in FIG. 3 and, thus, transistor 50 acts as a current buffer (or an impedance transformer) by transferring the oscillatory signal appearing at the collector of transistor 20 to terminal 16. Transistor 50 also provides a low impedance (its emitter resistance—$r_e$) at the collector of transistor 20 which reduces the miller multiplier effect of the collector-base capacitance of transistor 20 thereby extending the upper cutoff frequency of VCO circuit 70. Note that this reduction in the miller multiplier effect also applies to the VCO circuits shown in FIGS. 1 and 2.

Matching elements 78 and 80 can be utilized to provide a predetermined resistance at the output of VCO circuit 70 (terminal 16). Further, inductor 78 also provides a bias for the collector of transistor 50. The calculation of the output resistance ($R_{OUT}$) of VCO circuit 70 is a bit more complex than for VCO circuits 10 and 60 as expressed in EQN. 3. Therefore, a simplified expression is not included. However, actual test results indicate that by varying the value of inductor 78 or capacitor 80, the output resistance at terminal 16 may be adjusted to a predetermined value such as 50 ohms.

By now it should be apparent from the foregoing discussion that a novel voltage controlled oscillator (VCO) circuit having a cascoded output stage has been provided. The VCO circuit includes an oscillation stage which utilizes a negative resistance technique for oscillation, and an output stage that is coupled in cascode with the oscillation stage thereby minimizing the power dissipation and allowing the output resistance of the VCO circuit to be adjusted for maximum drive capability.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

I claim:

1. A voltage controlled oscillator circuit having an output, comprising;
   an oscillation stage including a first transistor within an oscillation loop, said oscillation loop having a total negative resistance such that said oscillation stage provides an oscillation signal having a predetermined frequency; and
   an output stage for transferring said oscillation signal from said oscillation stage to the output of the voltage controlled oscillator circuit, said output stage including a second transistor, said output stage being cascoded to said oscillation stage such that said first and second transistors are biased from an identical current thereby minimizing power dissipation of the voltage controlled oscillator circuit, said output stage further includes:
   (i) a first resistor coupled between a second supply voltage terminal and a collector of said second transistor for adjusting an output resistance of the voltage controlled oscillator circuit; and
   (ii) a negative feedback resistor coupled between said base and said collector of said second transistor.

2. The voltage controlled oscillator circuit according to claim 1 wherein said oscillation stage further includes:
   an inductor having first and second terminals, said second terminal of said inductor being coupled to a first supply voltage terminal;
   a first capacitor having first and second terminals, said first terminal of said first capacitor being coupled to a base of said first transistor, said second terminal of said first capacitor being coupled to said first terminal of said inductor;
   a second capacitor coupled between said emitter of said first transistor and said first supply voltage terminal;
   a second resistor coupled between said emitter of said first transistor and said first supply voltage terminal;
   a third resistor coupled between said base of said first transistor and said first supply voltage terminal; and
   said collector of said first transistor providing said oscillation signal to said output stage.

3. The voltage controlled oscillator circuit according to claim 2 further including
   a fourth resistor being coupled between said base of said second transistor and said base of said first transistor.

4. The voltage controlled oscillator circuit according to claim 1 wherein said oscillation stage further includes:
   an inductor having first and second terminals, said second terminal of said inductor being coupled to a first supply voltage terminal;
   a first capacitor having first and second terminals, said second terminal of said first capacitor being coupled to said first supply voltage terminal;
   a second capacitor coupled between said emitter of said first transistor and said first supply voltage terminal;
   a third capacitor being coupled to said first terminals of said inductor and said first capacitor and a base of said first transistor;
   a second resistor coupled between an emitter of said first transistor and said first supply voltage terminal;
   a third resistor coupled between said base of said first transistor and said first supply voltage terminal; and
   a collector of said first transistor providing said oscillation signal to said output stage.

5. The voltage controlled oscillator circuit according to claim 4 wherein said oscillation stage still further includes a fourth capacitor coupled across said base and said emitter of said first transistor.

6. The voltage controlled oscillator circuit according to claim 5 further including
   a fourth resistor being coupled between said base of said second transistor and said base of said first transistor.

7. A voltage controlled oscillator circuit having an output, comprising;
   an oscillation stage including a first transistor within an oscillation loop, said oscillation loop having a total negative resistance such that said oscillation stage provides an oscillation signal having a predetermined frequency; and
   an output stage for transferring said oscillation signal from said oscillation stage to the output of the voltage controlled oscillator circuit, said output stage including a second transistor, said output stage being cascoded to said oscillation stage such that said first and second transistors are biased from an identical current thereby minimizing power dissipation of the voltage controlled oscillator circuit, said output stage further includes a negative feedback capacitor coupled between a base of said second transistor and an emitter of said first transistor for reducing a miller effect on the voltage controlled oscillator circuit.

8. The voltage controlled oscillator circuit according to claim 7 wherein said oscillation stage further includes:
   an inductor having first and second terminals, said second terminal of said inductor being coupled to a first supply voltage terminal;
   a first capacitor having first and second terminals, said second terminal of said first capacitor being coupled to said first supply voltage terminal;
   a second capacitor coupled between said emitter of said first transistor and said first supply voltage terminal;
   a third capacitor being coupled to said first terminals of said inductor and said first capacitor and a base of said first transistor;
   a first resistor coupled between an emitter of said first transistor and said first supply voltage terminal;
   a second resistor coupled between said base of said first transistor and said first supply voltage terminal; and
   a collector of said first transistor providing said oscillation signal to said output stage.

9. The voltage controlled oscillator circuit according to claim 8 wherein said oscillation stage still further includes:
   a fourth capacitor coupled across said base and said emitter of said first transistor; and
   a fifth capacitor coupled between said collector of said first transistor and said first supply voltage terminal.

10. The voltage controlled oscillator circuit according to claim 9 wherein said output stage further includes;
    a third resistor being coupled between said base of said second transistor and said base of said first transistor;
    a fourth resistor being coupled between said base of said second transistor and a second supply voltage terminal;
    a matching inductor being coupled between said second supply voltage terminal and a collector of said second transistor; and
    a matching capacitor being coupled between said collector of said second transistor and the output of the voltage controlled oscillator circuit, said emitter of said second transistor being coupled to said collector of said first transistor.

11. A voltage controlled oscillator circuit having an output, comprising:
    a first transistor having a collector, a base and an emitter;
    a second transistor having a collector, a base and an emitter, said emitter of said second transistor being coupled to said collector of said first transistor, said collector of said second transistor being coupled to the output of the voltage controlled oscillator circuit;
    an inductor having first and second terminals, said second terminal of said inductor being coupled to a first supply voltage terminal;
    a first capacitor having first and second terminals, said first terminal of said first capacitor being coupled to said base of said first transistor, said second terminal of said first capacitor being coupled to said first terminal of said inductor;
    a second capacitor coupled between said emitter of said first transistor and said first supply voltage terminal;
    a first resistor coupled between said emitter of said first transistor and said first supply voltage terminal;
    a second resistor coupled between said base of said first transistor and said first supply voltage terminal;
    a third resistor being coupled between said base of said second transistor and said base of said first transistor;
    a fourth resistor being coupled between said collector of said second transistor and said base of said second transistor; and
    a fifth resistor being coupled between said collector of said second transistor and a second supply voltage terminal.

12. A voltage controlled oscillator circuit having an output, comprising:
    a first transistor having a collector, a base and an emitter;
    a second transistor having a collector, a base and an emitter, said emitter of said second transistor being coupled to said collector of said first transistor, said collector of said second transistor being coupled to the output of the voltage controlled oscillator circuit;
    an inductor having first and second terminals, said second terminal of said inductor being coupled to a first supply voltage terminal;
    a first capacitor having first and second terminals, said second terminal of said first capacitor being coupled to said first supply voltage terminal;
    a second capacitor coupled between said emitter of said first transistor and said first supply voltage terminal;
    a third capacitor having first and second terminals, said first terminal of said third capacitor being coupled to said first terminals of said inductor and said first capacitor, said second terminal of said third capacitor being coupled to said base of said first transistor;

a first resistor coupled between said emitter of said first transistor and said first supply voltage terminal;

a second resistor coupled between said base of said first transistor and said first supply voltage terminal;

a third resistor being coupled between said base of said second transistor and said base of said first transistor;

a fourth resistor being coupled between said collector of said second transistor and said base of said second transistor; and a fifth resistor being coupled between said collector of said second transistor and a second supply voltage terminal.

13. The voltage controlled oscillator circuit according to claim 12 further including a fourth capacitor being coupled across said base and said emitter of said first transistor.

* * * * *